(12) United States Patent
Tung

(10) Patent No.: US 7,639,087 B2
(45) Date of Patent: Dec. 29, 2009

(54) PHASE-LOCKED LOOP

(75) Inventor: Yen-Chang Tung, Taoyuan County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 102 days.

(21) Appl. No.: 11/671,230

(22) Filed: Feb. 5, 2007

(65) Prior Publication Data

US 2008/0042758 A1 Feb. 21, 2008

(30) Foreign Application Priority Data

Aug. 1, 2006 (TW) .............................. 95128086 A

(51) Int. Cl.
*H03L 7/00* (2006.01)
(52) U.S. Cl. ............................ 331/16; 331/17; 327/157
(58) Field of Classification Search ............. 331/16–18, 331/186; 327/156, 157; 455/260
See application file for complete search history.

(56) References Cited

U.S. PATENT DOCUMENTS 5,687,201 A * 11/1997 McClellan et al. .......... 375/374
5,815,042 A * 9/1998 Chow et al. .................... 331/57
6,426,680 B1 7/2002 Duncan et al.
6,661,267 B2 12/2003 Walker et al.
2005/0156673 A1* 7/2005 Pretl et al. ..................... 331/16
2005/0156684 A1* 7/2005 Chiu ........................... 331/185

* cited by examiner

*Primary Examiner*—James H. Cho
*Assistant Examiner*—Jany Tran
(74) *Attorney, Agent, or Firm*—J.C. Patents

(57) ABSTRACT

A phase-locked loop including a phase comparator, a charging/discharging unit, a low pass filter, a controlled oscillator, and a feedback unit is provided. The charging/discharging unit outputs a control signal according to the result of the phase comparator. The charging/discharging unit includes a compensation unit for compensating the control signal according to a compensation value. The controlled oscillator is electrically connected to the low pass filter and outputs an output signal. The controlled oscillator includes a copy unit which is electrically connected to the compensation unit to determine the compensation value according to an internal current of the controlled oscillator.

14 Claims, 11 Drawing Sheets

PHASE-LOCKED LOOP

CROSS-REFERENCE TO RELATED APPLICATION

This application claims the priority benefit of Taiwan application Ser. No. 95128086, filed Aug. 1, 2006. All disclosure of the Taiwan application is incorporated herein by reference.

BACKGROUND OF THE INVENTION

1. Field of Invention

The present invention relates to a phase-locked loop. More particularly, the present invention relates to a phase-locked loop having a function of automatic parameter adjustment.

2. Description of Related Art

A phase-locked loop (PLL) is a loop system for comparing output and input phases. Currently, the concept of phase locking has been applied in the electronic and communication fields extensively. The application of the PLL includes a frequency modulation (FM) and amplitude modulation (AM) demodulation apparatus, a frequency synthesizer, a frequency doubler, and a clock recovery circuits, etc.

FIG. 1 is a schematic view of the basic architecture of a conventional PLL. A PLL 100 includes a phase comparator 101, a charging/discharging unit 103, a low pass filter 105, a voltage-controlled oscillator 107, and a feedback unit 109. In the operation process of a normal PLL, the frequency is acquired first, and the internal frequency will be increased to 90% of the target frequency. After the difference between the internal frequency and the target frequency is within 10%, the phase-locking step is entered. Then, the phase is acquired, and the phase and frequency are locked eventually. As different locked frequencies have different control voltages, the PLL has different loop control parameters respectively, thus influencing the stability.

In order to stabilize the output frequency, a conventional method involves adding an analog-to-digital converter first. The analog-to-digital converter is connected to the low pass filter to detect the voltage on the low pass filter. Then, after the values output from the analog-to-digital converter are determined by a processor, a group of data is output to a digital-to-analog converter to be converted into an analog signal, so as to directly control the analog portion of the PLL. Otherwise, the loop parameters of the voltage-controlled oscillator or other parts are modulated directly by using the control signal output from the processor, such that the stability of the loop remains consistent, thereby achieving the optimization. The details of this method are described in U.S. Pat. No. 6,661,267 B2.

Another method involves adding an analog-to-digital converter to the low pass filter to detect the control voltage, and additionally adding a digital frequency detector to detect the output frequency. The two detection results are determined by a processor, and then a group of control signals is output to modulate the voltage-controlled oscillator or other loop parameters. The details of this method are described in U.S. Pat. No. 6,426,680 B1.

However, although the stability of the output frequency is improved through automatic adjustment of the PLL in the conventional art described above, as the analog-to-digital converter and complicated digital controller are added, the chip area and the power consumption increases, which leads to a high cost, low competitiveness, and complexity of the design.

SUMMARY OF THE INVENTION

An objective of the present invention is to provide a phase-locked loop, in which one function block in the phase-locked loop finely adjusts another function block, and a control is directly performed in an analog manner, so that the conversion between analog and digital signals is omitted, and the stability of the output frequency is improved.

Another objective of the present invention is to provide a phase-locked loop, in which other analog blocks are directly modulated by the use of one analog signal in the PLL, thereby achieving the purposes of simplifying the circuit and reducing the chip area and power consumption.

Based on the aforementioned and other objectives, the present invention provides a phase-locked loop, which comprises a phase comparator, a charging/discharging unit, a low pass filter, a controlled oscillator, and a feedback unit. The phase comparator is used to receive an input signal and a feedback signal and compare phases of the two signals. The charging/discharging unit is electrically connected to the phase comparator, and outputs a control signal according to the comparison result of the phase comparator. The charging/discharging unit comprises a compensation unit for compensating the control signal according to a first compensation value. The low pass filter is electrically connected to the charging/discharging unit. The controlled oscillator is electrically connected to the low pass filter for receiving the control signal filtered by the low pass filter, and determines the frequency of an output signal and outputs the output signal. The controlled oscillator comprises a copy unit electrically connected to the compensation unit to determine the first compensation value according to an internal current of the controlled oscillator. The feedback unit is electrically connected to the controlled oscillator for providing a feedback signal to the phase comparator according to the output signal.

In the phase-locked loop according to a preferred embodiment of the present invention, the compensation unit further comprises a first converting circuit for converting the control signal into a feedback current and transmitting the feedback current to a first terminal of a second current source.

From another viewpoint, the present invention provides a phase-locked loop, which comprises a phase comparator, a charging/discharging unit, a low pass filter, a controlled oscillator, and a feedback unit. The charging/discharging unit comprises a charging/discharging controller and a compensation unit. The charging/discharging controller is electrically connected to the phase comparator and outputs a control signal according to the comparison result of the phase comparator. The compensation unit is electrically connected to the charging/discharging controller and receives the control signal to determine the compensation amount of the control signal output from the charging/discharging controller.

The present invention directly modulates other analog blocks by the use of one analog signal of the PLL, so as to achieve the function of automatic modulation. With the conversion between analog and digital signals omitted, the circuit area and the power consumption can be saved.

In order to make the aforementioned and other objects, features and advantages of the present invention comprehensible, preferred embodiments accompanied with figures are described in detail below.

DESCRIPTION OF EMBODIMENTS

The design parameters of a PLL mainly include the gain of the phase comparator, the current input to the low pass filter, the gain of the low pass filter, and the gain of the voltage-controlled oscillator, etc. Among these parameters, the gain of the lower pass filter has the most impact on the stability of the loop. Therefore, the gain of the low pass filter must be kept as stable as possible.

Figure 1:
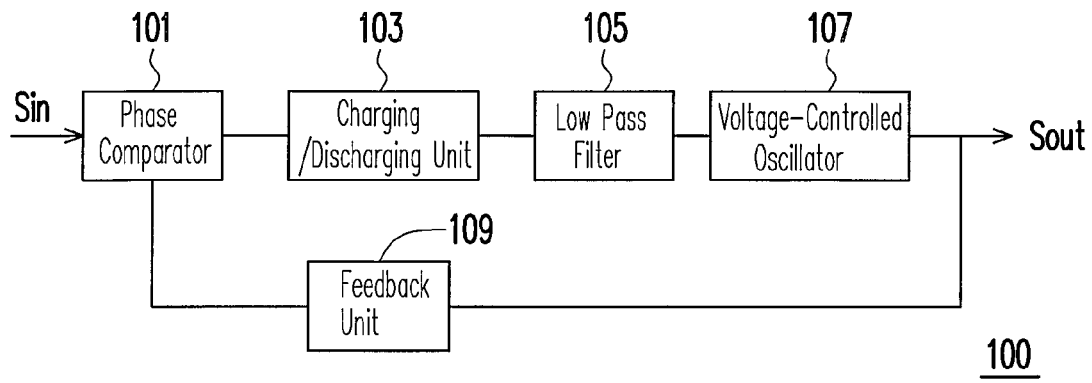
FIG. 1 is a schematic view of the basic architecture of a conventional PLL.
Figure 2:
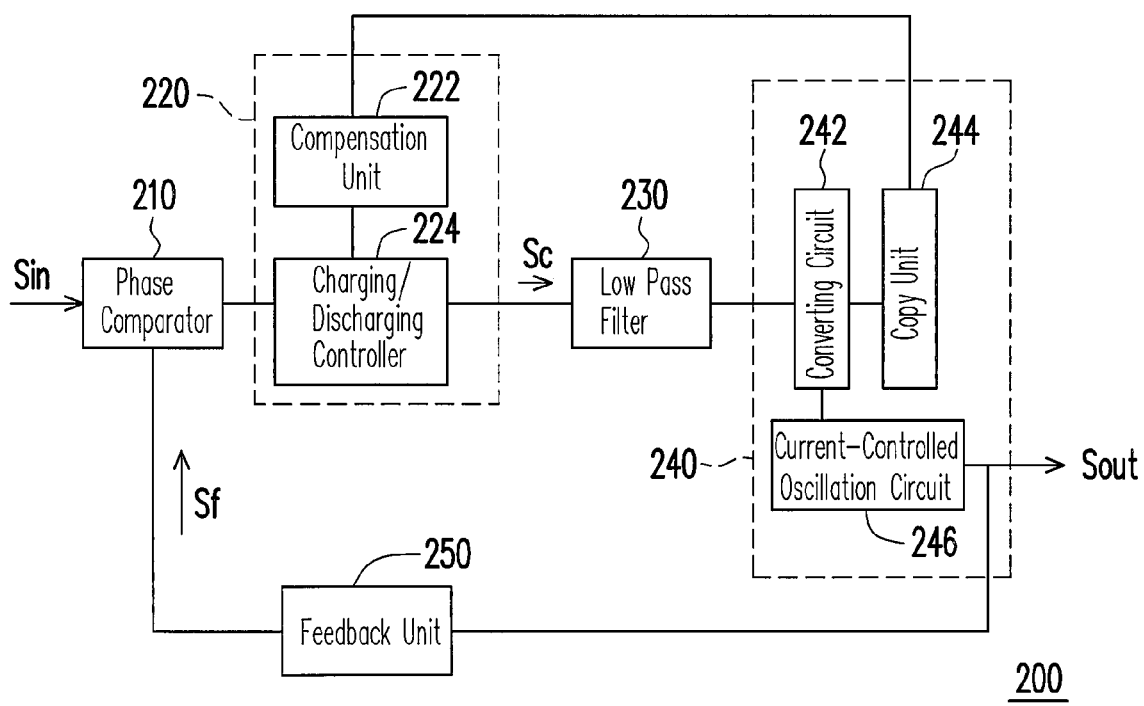
FIG. 2 is an architecture view of a phase-locked loop according to a preferred embodiment of the present invention.

FIG. 2 is an architecture view of a phase-locked loop according to a preferred embodiment of the present invention. Referring to FIG. 2, the PLL 200 includes a phase comparator 210, a charging/discharging control unit 220, a low pass filter 230, a controlled oscillator 240, and a feedback unit 250. The charging/discharging control unit 220 includes a compensation unit 222 and a charging/discharging controller 224, and the controlled oscillator 240 includes a converting circuit 242, a copy unit 244, and a current-controlled oscillation circuit 246. The phase comparator 210 is used to receive an input signal Sin and a feedback signal Sf, and to compare phases of the two signals. The charging/discharging control unit 220 is connected to the phase comparator 210 and outputs a control signal Sc according to the comparison result of the phase comparator 210. The compensation unit 222 compensates the control signal Sc according to a compensation value.

The low pass filter 230 is electrically connected to the charging/discharging unit 220. The controlled oscillator 240 is electrically connected to the low pass filter 230. The controlled oscillator 240 receives the control signal Sc filtered by the low pass filter 230 to determine the frequency of an output signal Sout and outputs the output signal Sout. The copy unit 244 is electrically connected to the compensation unit 222 and determines the compensation value for the compensation unit 222 according to an internal current of the controlled oscillator 240. The feedback unit 250 is electrically connected to the controlled oscillator 240, so as to provide the feedback signal Sf to the phase comparator 210 according to the output signal Sout. Therefore, the copy unit 244 determines the compensation value according to the internal current converted from the control signal Sc, and transmits the compensation value to the compensation unit 222. Further, the control signal Sc output from the charging/discharging unit 220 is adjusted as required, thereby realizing the automatic modulation.

Compared with the conventional art, the present embodiment modulates the charging/discharging controller directly by the use of one analog signal of the controlled oscillator in the PLL, so as to realize the automatic modulation. The automatic modulation allows the PLL to have the same stability at different operating frequencies, and also allows the modulation result to be changed as if necessary to realize special functions. In the special design, different operating frequencies require different degrees of stability, and this method can change the degree of stability to meet different requirements. Furthermore, different from the conventional art, the present invention does not require the analog-to-digital converter and the complicated digital control. Therefore, the chip area and the power consumption are reduced, thereby reducing the cost, enhancing the competitiveness, and simplifying the design.

Figure 3:
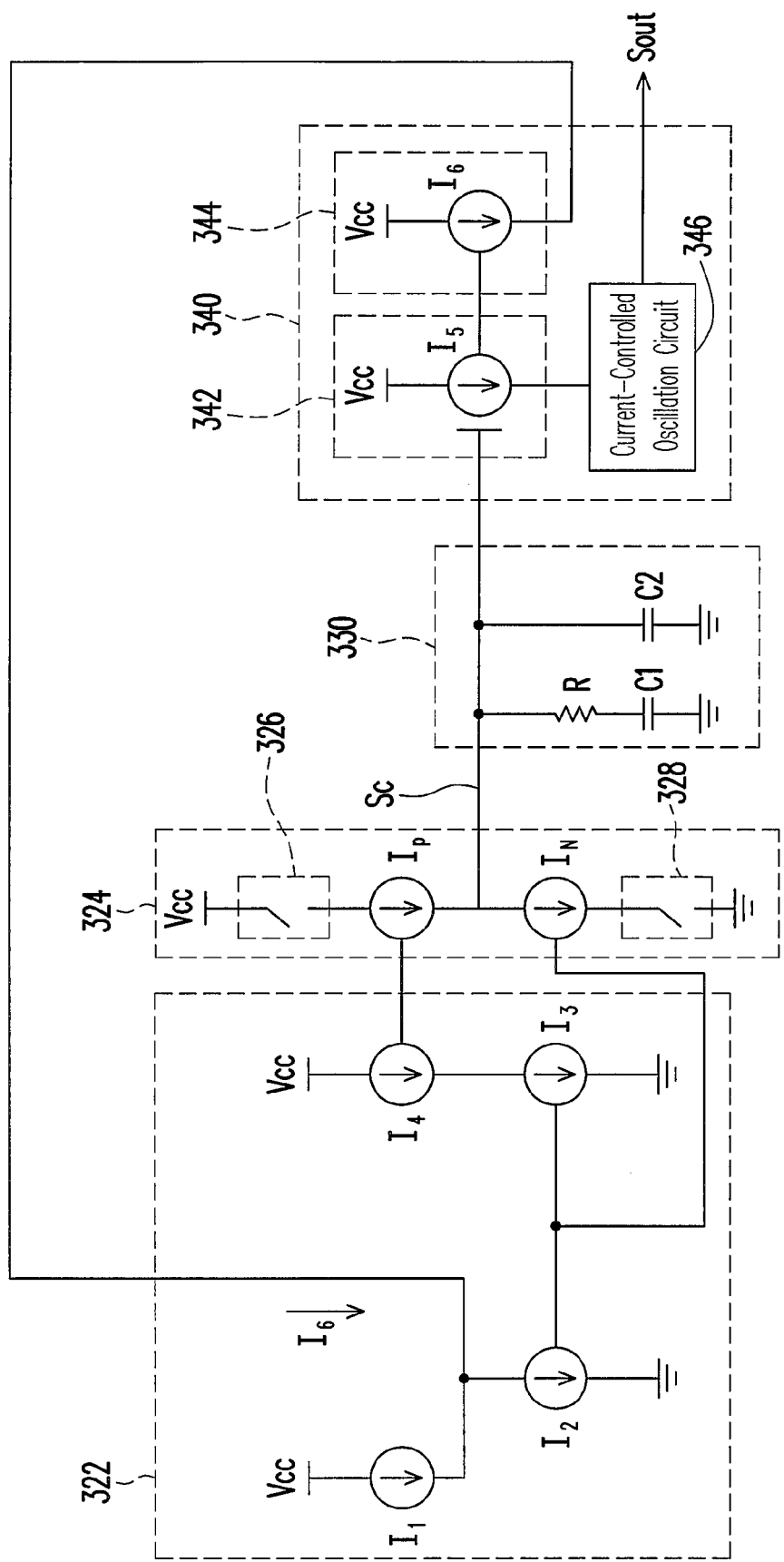
FIG. 3 is a partial architecture schematic view of the phase-locked loop of FIG. 2.

FIG. 3 is a partial architecture view of the phase-locked loop of FIG. 2. Referring to FIG. 3, the architecture includes a compensation unit 322, a charging/discharging controller 324, a low pass filter 330, and a controlled oscillator 340. The compensation unit 322 includes a plurality of current sources. In the present embodiment, a first current source $I_1$, a second current source $I_2$, a third current source $I_3$, and a fourth current source $I_4$ are taken as example. In practice, different designs are allowed in accordance with the requirements.

The charging/discharging controller 324 includes a first switch 326, a second switch 328, a charging current source $I_P$, and a discharging current source $I_N$. One terminal of the first switch 326 is connected to the supply voltage Vcc, and one terminal of the second switch 328 is grounded. The charging/discharging controller 324 is electrically connected to the phase comparator (not shown), the compensation unit 322, and the low pass filter 330. The low pass filter 330 includes a resistor R, a first capacitor C1, and a second capacitor C2, and is electrically connected to the controlled oscillator 340. The controlled oscillator 340 includes a converting circuit 342, a copy unit 344, and a current-controlled oscillation circuit 346, and generates an output signal Sout. Here, for example, the converting circuit 342 includes a fifth current source $I_5$, and the copy unit 344 includes a sixth current source $I_6$. In practice, different designs are allowed in accordance with the requirements.

Figure 3A:
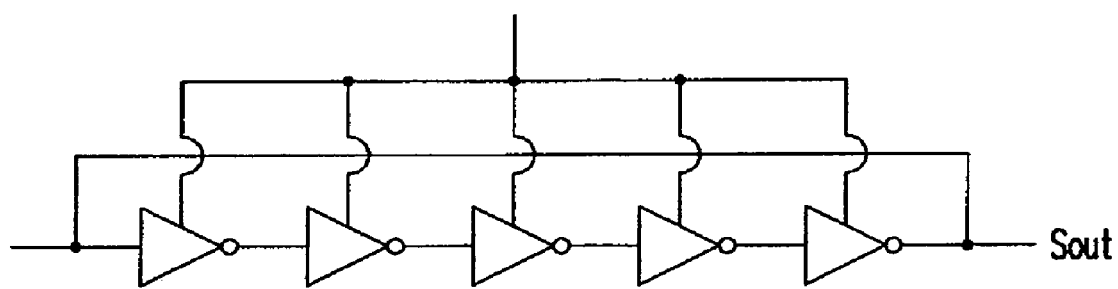
FIG. 3A is a schematic view illustrating an odd number of NOT gates.

Referring to FIG. 3 again, firstly, the charging/discharging unit 324 determines the connection state of the first switch 326 and the second switch 328 according to the comparison result of the phase comparator (not shown, referring to FIG. 2 for details), and outputs the current of the charging current source $I_p$ or the discharging current source $I_N$ as the control signal Sc. The low pass filter 330 receives the control signal Sc, and filters out high-frequency noises. The control signal Sc filtered by the low pass filter 330 is then converted into a control current by the converting circuit 342. In the present embodiment, the converting circuit 342 including the fifth current source $I_5$ is taken as example. However, other designs are also allowed in accordance with the requirements in practice. One terminal of the fifth current source $I_5$ is connected to the supply voltage Vcc, and the value of the current of the fifth current source $I_5$ is determined according to the control signal Sc. The current-controlled oscillation circuit 346 determines the frequency of the output signal Sout according to the conversion result of the converting circuit 342, and outputs the output signal Sout. The current-controlled oscillation circuit 346 includes, for example, referring to FIG. 3A, an odd number of NOT gates. The NOT gates are connected in series, thus forming an NOT gate series. An input terminal of the NOT gate series is electrically connected to an output terminal of the NOT gate series, and the output terminal of the NOT gate series provides the output signal Sout. The operating speed of these NOT gates is determined by the control current.

The copy unit 344 copies the fifth current source $I_5$. In the present embodiment, the converting circuit 344 including the sixth current source $I_6$ is taken as example. In practice, other designs are also allowed in accordance with the requirements. The value of the current of the sixth current source $I_6$, i.e., the compensation value, is determined according to the fifth current source $I_5$. The compensation value is input into the compensation unit 322 and compensates the control signal Sc output from the charging/discharging controller 324, thereby realizing the automatic modulation.

In the present embodiment, the method of adjusting the sixth current source $I_6$ involves, for example, adjusting the sixth current source $I_6$ according to the fifth current source $I_5$ by combining the copy unit 344 and the converting circuit 342 into a current mirror. However, in practice, the adjusting method is not limited to this. The current of the sixth current source $I_6$ is input into the compensation unit 322. In the compensation unit 322, the first current source $I_1$ can be a reference current, i.e., the current value thereof can be designed according to the actual requirements, and the sum of the currents of the first current source $I_1$ and the sixth current source $I_6$ is the current of the second current source $I_2$. The value of the current of the third current source $I_3$ is determined according to the value of the current of the second current source $I_2$. The present embodiment can also be implemented by combining the third current source $I_3$ and the second current source $I_2$ into a current mirror. One terminal of the fourth current source $I_4$ is connected to the supply voltage Vcc, and the other terminal is connected to the third current source $I_3$.

Figure 4A:
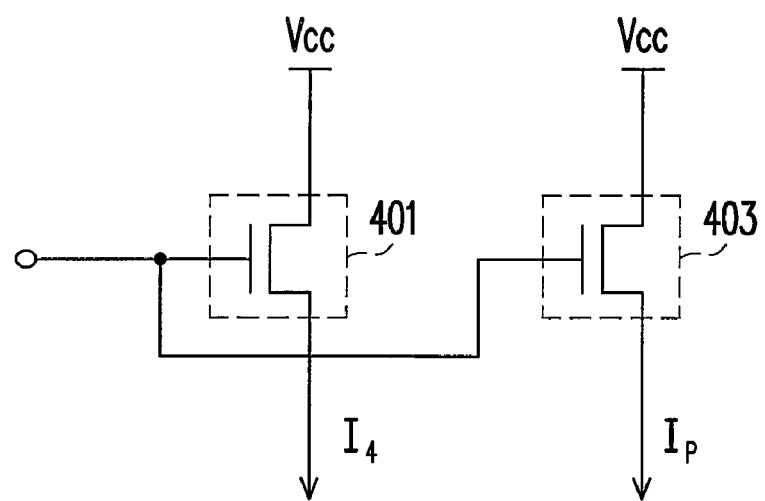
FIGS. 4A-4D are circuit diagrams of different implementation methods of the output of the copy unit of FIG. 2.
Figure 4B:
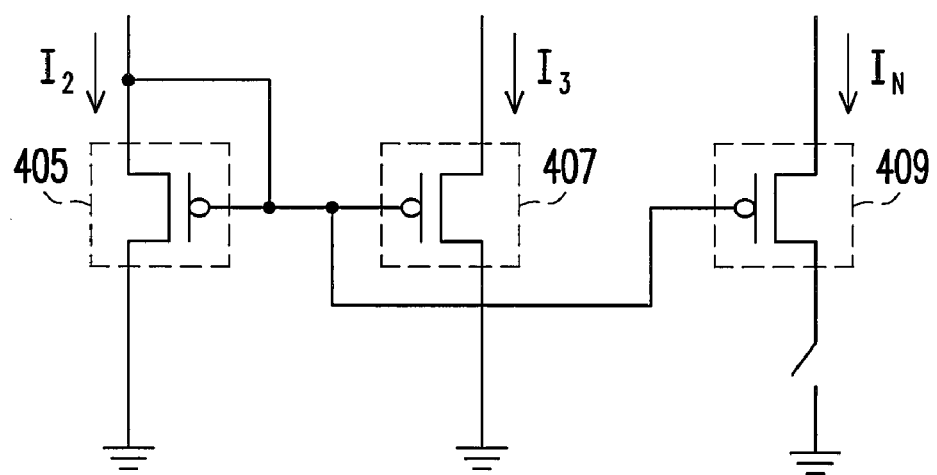

The charging current source $I_P$ is electrically connected to the fourth current source $I_4$, and the discharging current source $I_N$ is electrically connected to the second current source $I_2$. For example, the current sources $I_P$ and $I_4$ can be implemented with reference to FIG. 4A, i.e., N-type metal oxide semiconductor (NMOS) transistors 401 and 403 are used to implement the current sources $I_P$ and $I_4$. Here, the charging current source $I_P$ and the fourth current source $I_4$ are combined into one current mirror architecture. Moreover, the current sources $I_2$, $I_3$, and $I_N$ can be implemented with reference to FIG. 4B, i.e., P-type metal oxide semiconductor (PMOS) transistors 405, 407, and 409 are used, and the second current source $I_2$, the third current source $I_3$, and the discharging current source $I_N$ are combined into another current mirror architecture. It is known from the above that the charging current source $I_P$ determines the current value thereof according to the value of the current of the fourth current source $I_4$, and the discharging current source $I_N$ determines the current value thereof according to the value of the current of the second current source $I_2$.

As the voltage on the low pass filter 330 is converted into the control current by the converting circuit 342 in the controlled oscillator 340, and the control current is then provided to the current-controlled oscillation circuit, the control current can be copied to form another current to control other parts of the PLL and further to adjust the loop parameters of the PLL. Thus, the gains of the controlled oscillator 340 and the low pass filter 330 can be automatically compensated, the loop can output the controlled stable frequency in different states, and the control voltage on the low pass filter 330, is not influenced.

Figure 4C:
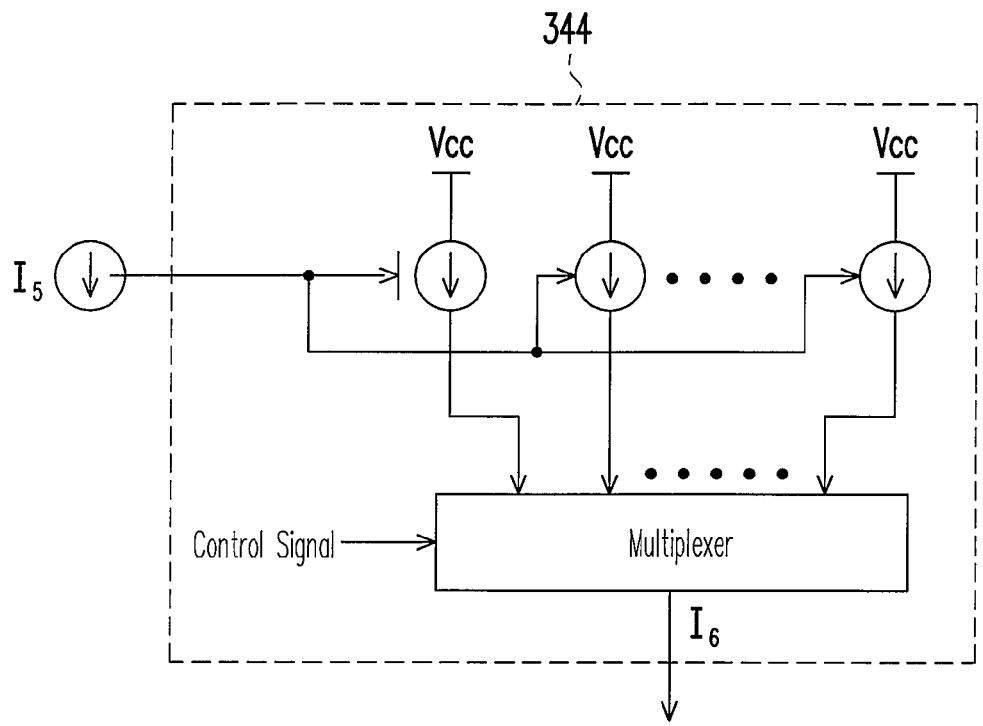
Figure 4D:
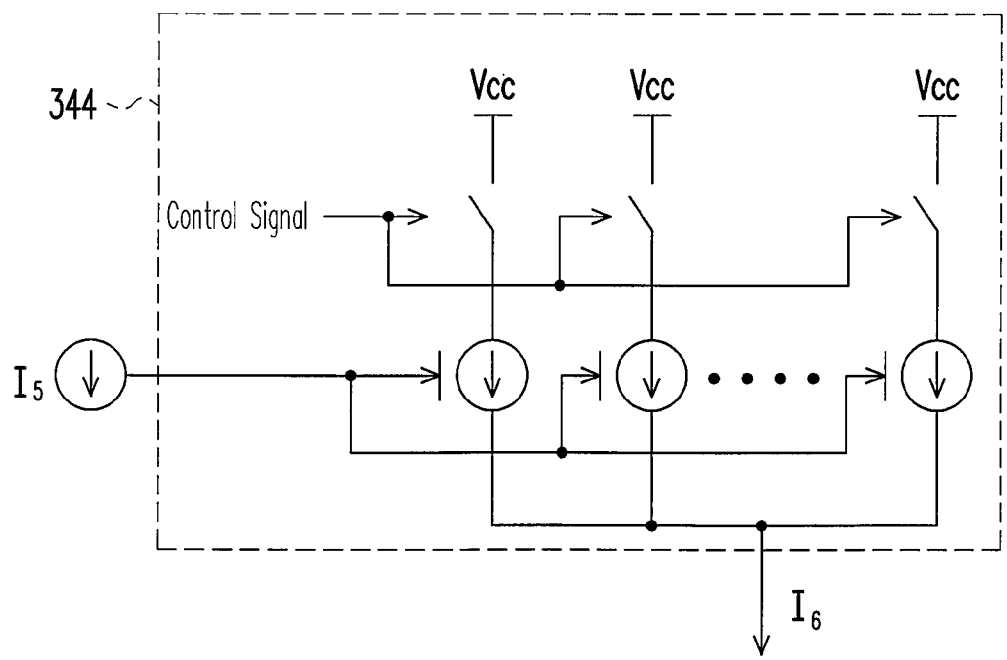

It should be noted that in addition to the current mirror architecture described above, a second implementation method as shown in FIG. 4C can also be used to adjust the value of the current output from the copy unit 344. Here, the copy unit 344 is formed by a plurality of current sources and determines which current source is selected according to a control signal. Therefore, different magnitudes of the current source $I_6$ in the copy unit 344 are available to be selected, thus providing more options. A third implementation method is as shown in FIG. 4D. The copy unit 344 includes a plurality of current sources, and each current source is controlled by a corresponding switch. Therefore, the control signal can be used to determine which current source will be selected, and the value of the current output from the copy unit 344 is the sum of the values of the selected currents. Thus, the variability of the output current can also be improved. However, various compositions of the copy unit 344 described above are only examples for the convenience of illustration, and are not limited to this in practice.

Figure 5A:
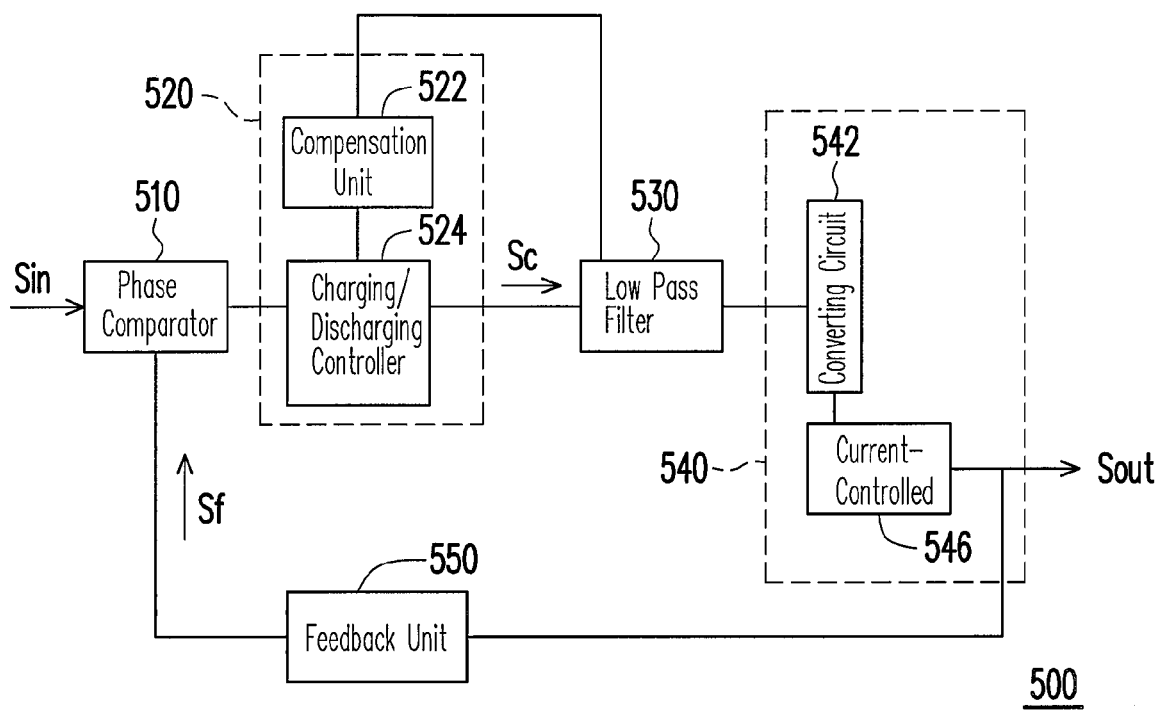
FIG. 5A illustrates an embodiment of another phase-locked loop according to the present invention.

The implementation of the present invention is not limited to the method described above. For example, FIG. 5A illustrates an embodiment of another phase-locked loop according to the present invention. Referring to FIG. 5A, a PLL 500 includes a phase comparator 510, a charging/discharging control unit 520, a low pass filter 530, a controlled oscillator 540, and a feedback unit 550. The charging/discharging control unit 520 includes a compensation unit 522 and a charging/discharging controller 524, and the controlled oscillator 540 includes a converting circuit 542 and a current-controlled oscillation circuit 546. The phase comparator 510 is used to receive an input signal Sin and a feedback signal Sf, and to compare phases of the two signals. The charging/discharging control unit 520 is connected to the phase comparator 510 and outputs a control signal Sc according to the comparison result of the phase comparator 510. The compensation unit 522 compensates the control signal Sc according to the compensation value. The low pass filter 530 is electrically connected to the charging/discharging unit 520 to filter the control signal Sc output from the charging/discharging unit 520.

The charging/discharging controller 524 is electrically connected to the phase comparator 510 and the low pass filter 530 and outputs the control signal Sc to the low pass filter 530 according to the comparison result of the phase comparator 510. The compensation unit 522 is electrically connected to the charging/discharging controller 524 and the low pass filter 530 and determines a compensation value for the compensation unit 522 according to the control signal filtered by the low pass filter 530. The compensation unit 522 compensates the control signal Sc output from the charging/discharging 524 according to the compensation value. The controlled oscillator 540 is electrically connected to the low pass filter 530. The controlled oscillator 540 receives the control signal filtered by the low pass filter 530 to determine the frequency of an output signal Sout and outputs the output signal Sout.

The converting circuit 542 converts the control signal filtered by the low pass filter 530 into a control current. The current-controlled oscillation circuit 546 is electrically connected to the converting circuit 542 and determines the frequency of the output signal Sout according to the above control current. The feedback unit 550 is electrically connected between the controlled oscillator 540 and the phase comparator 510 and provides a feedback signal Sf to the phase comparator 510 according to the output signal Sout.

Compared with the conventional art, the PLL 500 of the present embodiment modulates the output of the charging/discharging controller 524 directly according to an analog signal of the low pass filter 530 by using the compensation unit 522 to realize the automatic modulation. Furthermore, as the present invention does not need the analog-to-digital converter and the complicated digital control, the chip area and the power consumption are reduced, thereby reducing the cost, enhancing competitiveness, and simplifying the design.

Figure 5B:
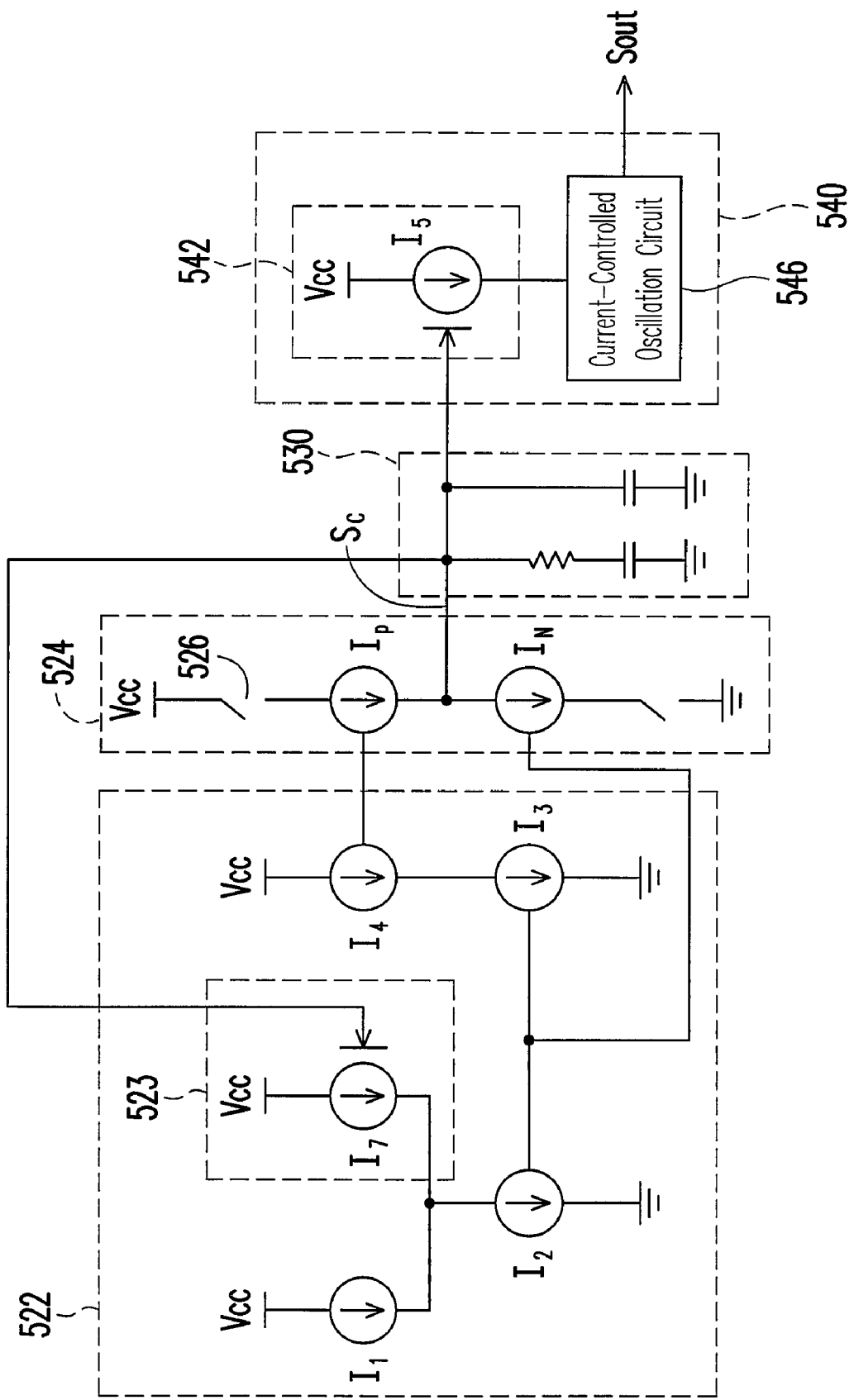
FIG. 5B is a partial circuit diagram of the phase-locked circuit of FIG. 5A according to an embodiment of the present invention.

FIG. 5B is a partial circuit diagram of the phase-locked circuit of FIG. 5A according to an embodiment of the present invention. Referring to FIG. 5B, the compensation unit 522 includes a plurality of current sources. In the present embodiment, a first current source $I_1$, a second current source $I_2$, a third current source $I_3$, and a fourth current source $I_4$ are taken as example. In practice, different designs are also allowed in accordance with the requirements. In the present embodiment, the charging/discharging controller 524 and the low pass filter 530 can be implemented with reference to the charging/discharging controller 324 and the low pass filter 330 of FIG. 3, so the details will not be described herein again. The charging/discharging controller 524 is electrically connected to the phase comparator (not shown), the compensation unit 522, and the low pass filter 530. The low pass filter 530 is electrically connected to the controlled oscillator 540. The controlled oscillator 540 includes a second converting circuit 542 and the current-controlled oscillation circuit 546. Here, the converting circuit 542 including the fifth current source $I_5$ is taken as example, and other designs are also allowed in accordance with the requirements in practice.

Firstly, the charging/discharging unit 524 determines the connection state of the first switch 526 and the second switch 528 according to the comparison result of the phase comparator (not shown, referring to FIG. 5A for details), and outputs the current of the charging current source $I_P$ or the discharging current source $I_N$ as the control signal Sc. The low pass filter 530 receives the control signal Sc, and filters out the high-frequency noise. The control signal Sc filtered by the low pass filter 530 is then converted into a control current by the converting circuit 542. The value of the control current output from the fifth current source $I_5$ is determined according to the control signal Sc. The current-controlled oscillation circuit 546 determines the frequency of the output signal Sout according to the conversion result of the converting circuit 542, and outputs the output signal Sout. In the present embodiment, the current-controlled oscillation circuit 546 can be implemented with reference to the current-controlled oscillation circuit 346 shown in FIG. 3, so the details will not be described herein again.

In the compensation unit 522, a first converting circuit 523 converts the control signal Sc into a feedback current and outputs it. In the present embodiment, the converting circuit 523 includes a seventh current source $I_7$. The first current source $I_1$ can be a reference current, i.e., the current value thereof can be designed as required. The sum of the first current source $I_1$ and the seventh current source $I_7$ is the current of the second current source $I_2$. The value of the current of the third current source $I_3$ is determined according to the value of the current of the second current source $I_2$. The present embodiment can also be implemented by combining the third current source $I_3$ and the second current source $I_2$ into a current mirror. One terminal of the fourth current source $I_4$ is connected to the supply voltage Vcc, and the other terminal is connected to the third current source $I_3$.

Referring to FIG. 5B again, the charging current source $I_P$ is electrically connected to the fourth current source $I_4$, and the discharging current source $I_N$ is electrically connected to the second current source $I_2$. The current sources $I_P$ and $I_4$ can be implemented with reference to FIG. 4A. Here, the charging current source $I_P$ and the fourth current source $I_4$ are combined into one current mirror architecture. Moreover, the current sources $I_2$, $I_3$, and $I_N$ can be implemented with reference to FIG. 4B. It is known from the above that the charging current source $I_P$ determines the current value thereof according to the value of the current of the fourth current source $I_4$, and the discharging current source $I_N$ determines the current value thereof according to the value of the current of the second current source $I_2$.

The voltage on the low pass filter 530 is converted into the control current by the converting circuit 542 in the controlled oscillator, and then the control current is provided to the current-controlled oscillation circuit 546. In the present embodiment, the voltage on the low pass filter 530 directly controls the seventh current source $I_7$, so the amount of the current of the seventh current source $I_7$ can be determined directly according to the control signal filtered by the low pass filter 530. Then, the current determines the compensation amount to the control signal Sc output from the charging/discharging controller 524. Further, the loop parameters of the PLL 500 are adjusted to automatically compensate the gains of the controlled oscillator 540 and the low pass filter 530, such that the loop can output the controlled stable frequencies in different states, and meanwhile the control voltage on the low pass filter 530 is not influenced.

Figure 5C:
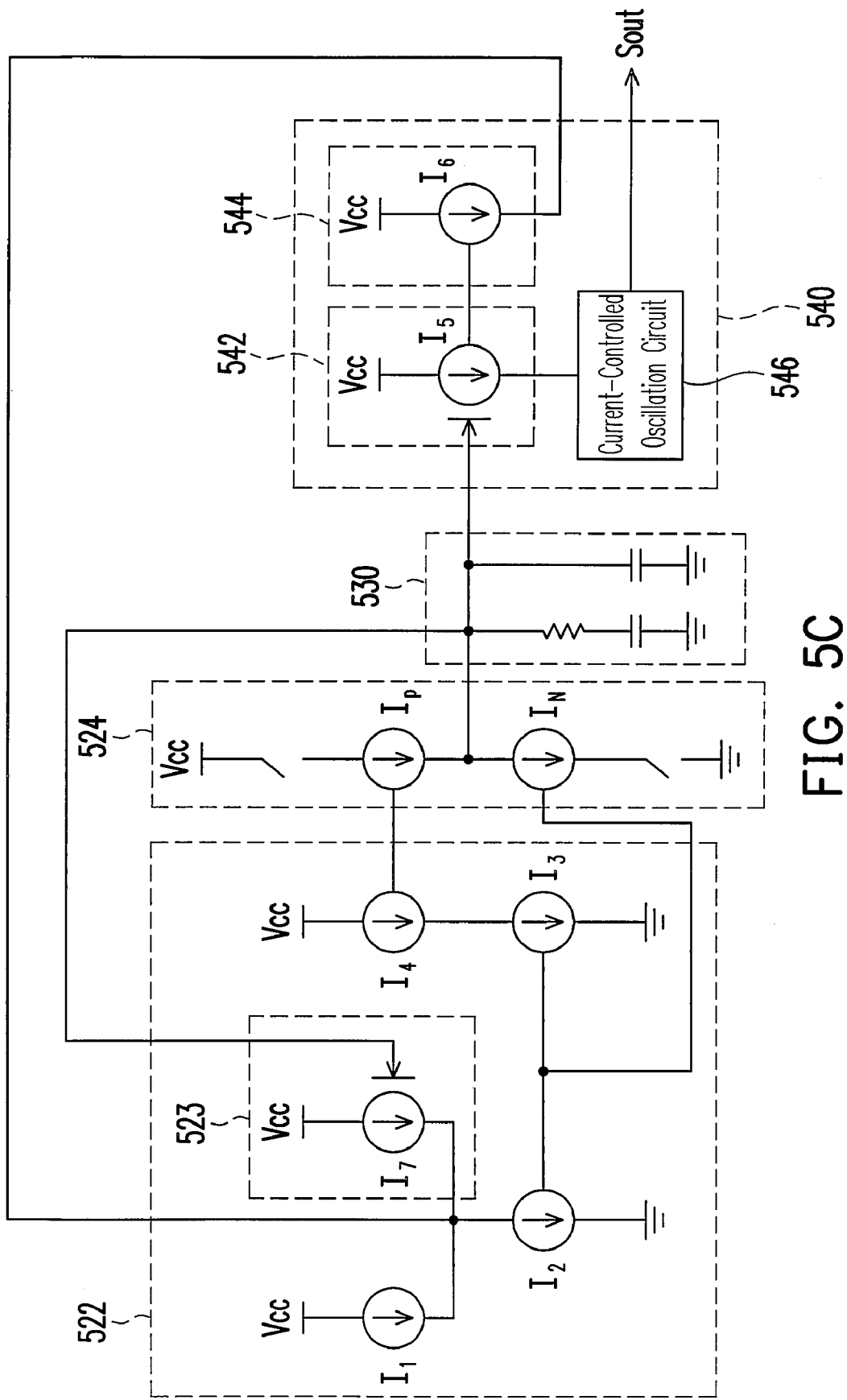
FIG. 5C is a partial architecture view of a phase-locked loop according to another preferred embodiment of the present invention.

FIG. 5C is a partial architecture view of a phase-locked loop according to another preferred embodiment of the present invention. The main difference between the present embodiment and the embodiment of FIG. 3 is that the compensation Unit 522 further includes a first converting circuit 523. In the present embodiment, the converting circuit 523 includes a seventh current source $I_7$. The converting circuit 523 is electrically connected to the low pass filter and converts the control signal filtered by the low pass filter into the feedback current, i.e., the seventh current source $I_7$ of the present embodiment. Therefore, the current of the second current source $I_2$ is the sum of the first current source $I_1$, the sixth current source $I_6$, and the seventh current source $I_7$. As a result, the factors that influence the value of the current of the second current source $I_2$ further include the seventh current source $I_7$ of the converting circuit 523 in addition to the sixth current source $I_6$ output from the copy unit 544. Therefore, the modulation function of the automatic modulation is increased, such that the loop can output the controlled stable frequencies in different states.

Figure 6:
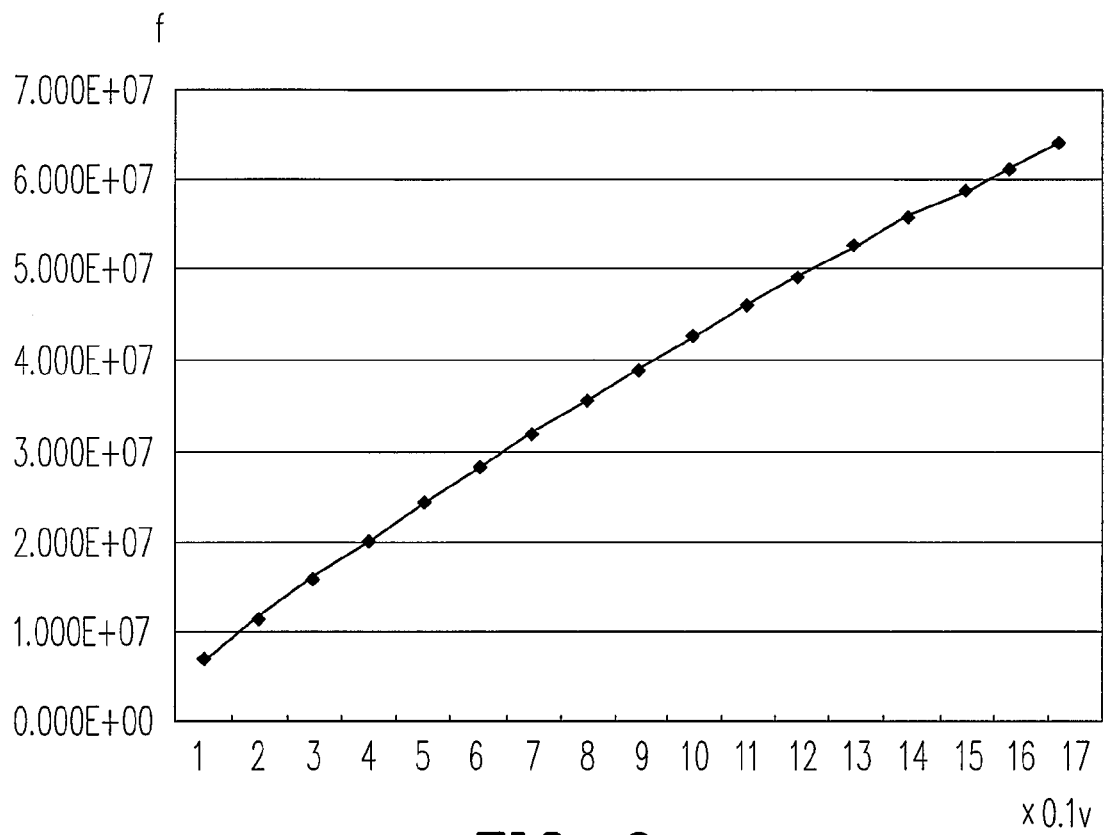
FIG. 6 is a graph of the relationship between the control voltage of the controlled oscillator and the frequency of the output signal in a preferred embodiment of the present invention.
Figure 7:
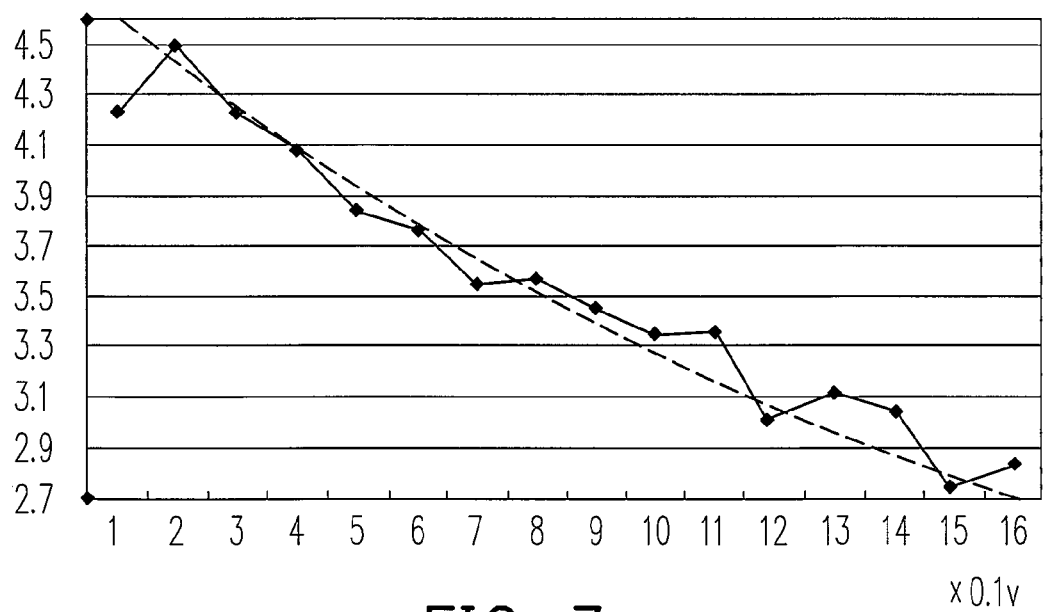
FIG. 7 is a graph of the relationship between the control voltage and the gain of the controlled oscillator in a preferred embodiment of the present invention.
Figure 8:
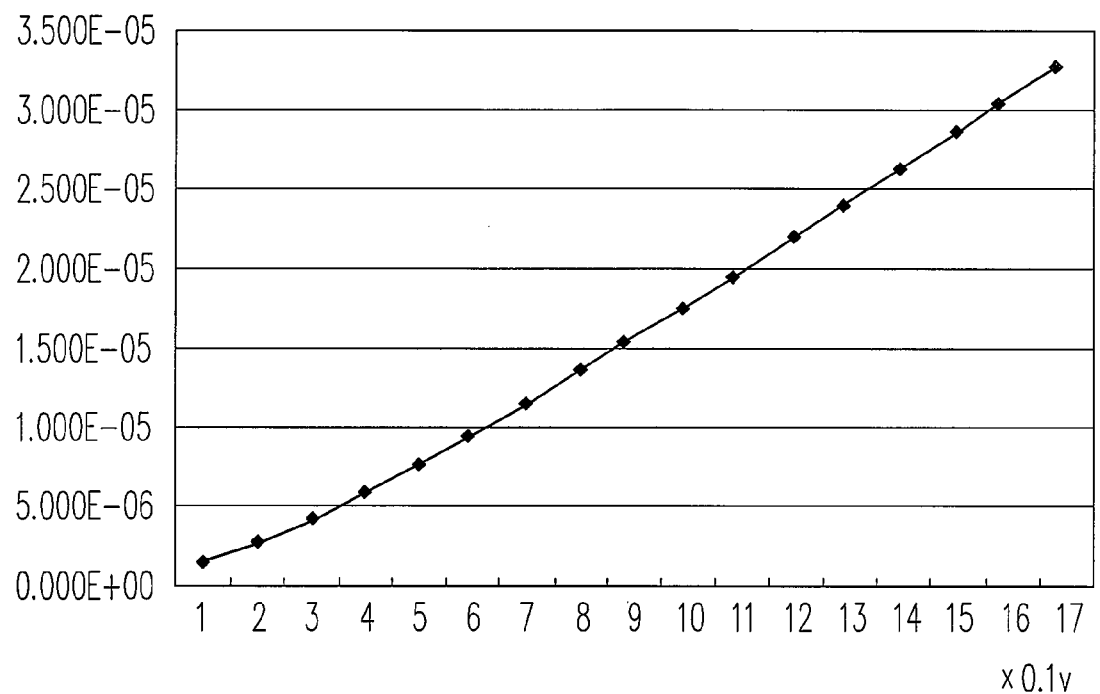
FIG. 8 is a graph of the relationship between the control voltage and the output current in a preferred embodiment of the present invention.
Figure 9:
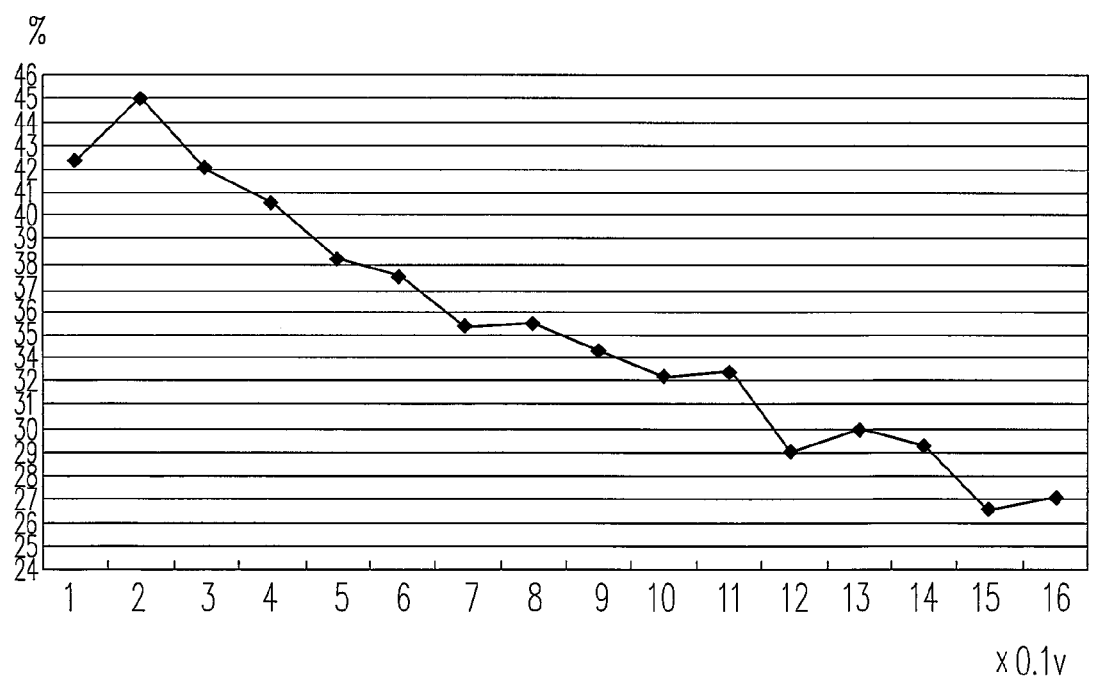
FIG. 9 is a curve graph of the control voltage and the variation of the loop parameters according to the conventional art.

FIG. 6 is a curve graph illustrating the change of the frequency of the controlled oscillator in response to different input control voltages. In theory, it can be substantially concluded that the higher the control voltage is, the less the slope of the frequency to the voltage is. FIG. 7 is a curve graph illustrating the change of the gain of the controlled oscillator in response to different input control voltages. It can be simply concluded that the control voltage is approximately in reverse proportion to the gain of the controlled oscillator. FIG. 8 shows the change of the output current of the controlled oscillator in response to different input control voltages. And the voltage/current converting circuit in which the control voltage is in positive proportion to the output current is used. FIG. 9 shows the change of different control voltages of the low pass filter relative to the open loop parameters. It is apparent that modifications can be made as required or different adjustment parameters can be used for different sections.

Figure 10:
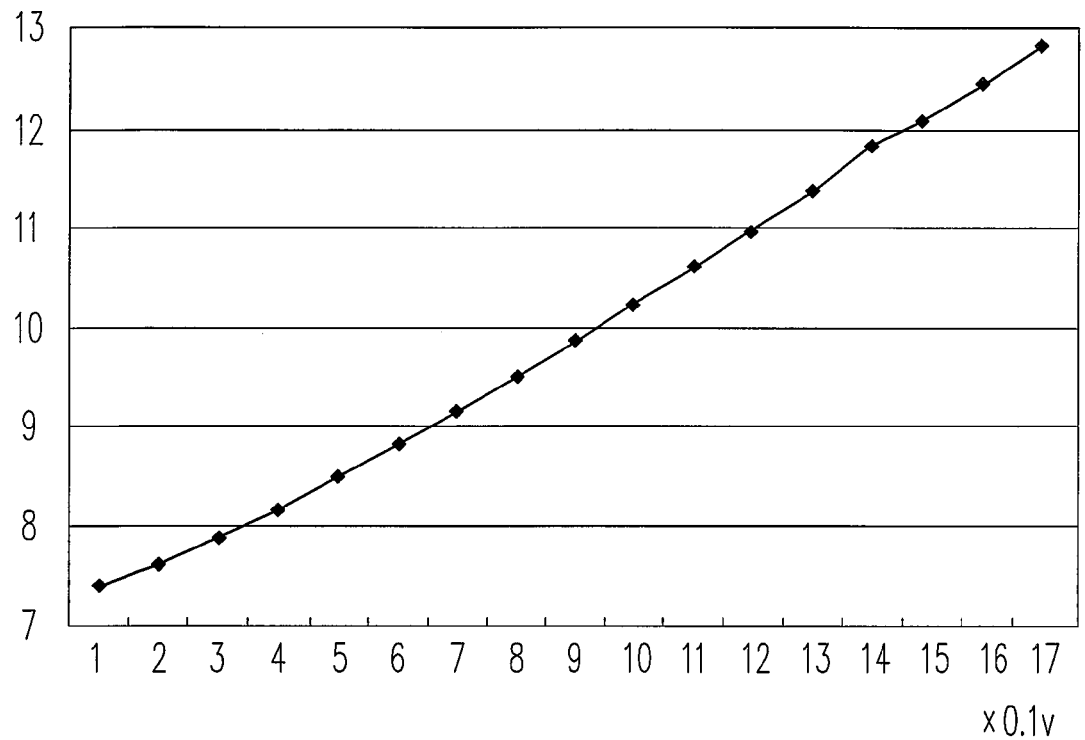
FIG. 10 is a curve graph of the variation of the current and the control voltage of the charging/discharging controller in a preferred embodiment of the present invention.
Figure 11:
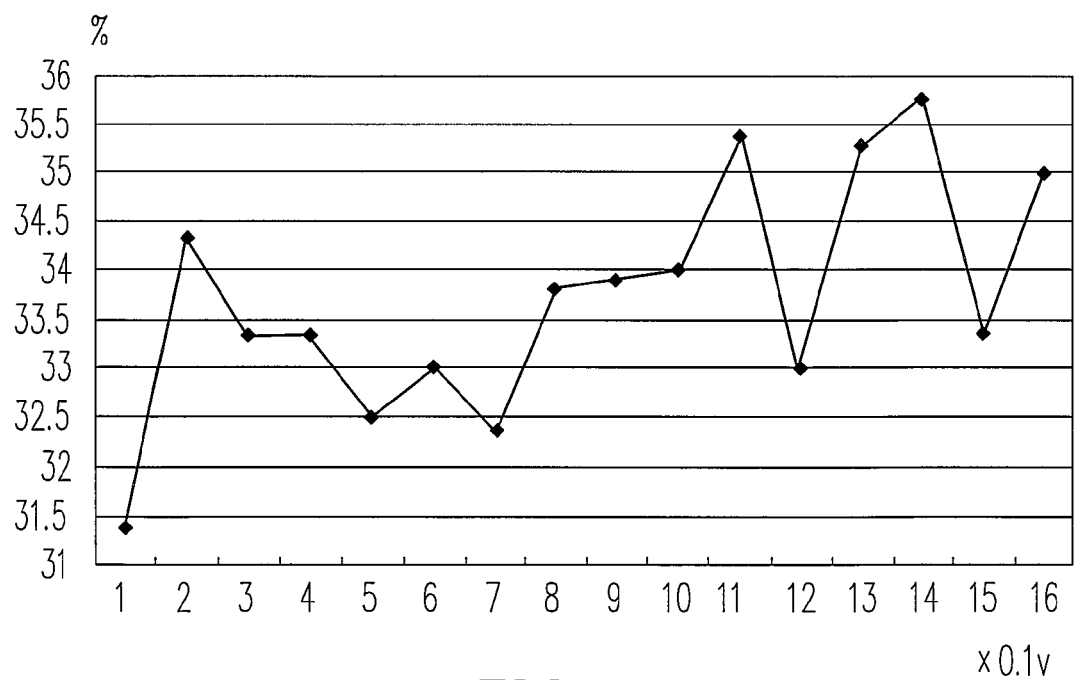
FIG. 11 is a curve graph of the control voltage and the variation of the loop parameters in a preferred embodiment of the present invention.

It is known from FIG. 7 that the magnitude of the change of the gain of the voltage-controlled oscillator is about 1.8 times, and from FIG. 8 the output current is 0-35 mA. If the target value of current of the charging/discharging controller is 10 mA, the present embodiment can modify the current of the charging/discharging controller to 7.14 mA, and the copied current output from the controlled oscillator is 0-5.71 mA. Therefore, the current of the charging/discharging controller changes between 7.14 mA to 12.85 mA, and thus the automatic compensation is realized. FIG. 10 shows the change of the current of the charging/discharging controller relative to different control voltages according to a preferred embodiment of the present invention. FIG. 11 shows the change of different control voltages on the low pass filter relative to the loop parameters according to a preferred embodiment of the present invention. After comparing FIG. 9 and FIG. 11, it is found that the variation of the loop parameters which is about 30% in FIG. 9 is reduced to about 8% as shown in FIG. 11. Thus, it is obvious that the present invention can be used to improve the stability of the loop substantially.

To sum up, in the present invention, an automatic detecting circuit is added into the PLL and the operation of the PLL can be automatically adjusted. The automatic control method is simple, and the automatic control can be realized without using additional analog-to-digital converter (DAC), digital-to-analog converter (DAC), and the complicated digital control circuit, and thus the design is simplified. Moreover, as the analog control manner is adopted, the interference caused by digital signals can also be reduced.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase-locked loop, comprising:
    a phase comparator, for receiving an input signal and a feedback signal to compare phases of the input signal and the feedback signal;
    a charging/discharging unit, connected to the phase comparator, for outputting a control signal according to a comparison result of the phase comparator, wherein the charging/discharging unit comprises a compensation unit for compensating the control signal according to a first compensation value;
    a low pass filter, connected to the charging/discharging unit, for filtering the control signal output from the charging/discharging unit;
    a controlled oscillator, connected to the low pass filter, for converting the control signal filtered by the low pass filter to a control current and determining a frequency of an output signal according to the control current, wherein the controlled oscillator comprises a copy unit, connected to the compensation unit, for generating a plurality of candidate currents by copying the control current so as to determine the first compensation value by switching the candidate currents; and
    a feedback unit, connected to the controlled oscillator, for providing the feedback signal to the phase comparator according to the output signal.

2. The phase-locked loop as claimed in claim 1, wherein the charging/discharging unit further comprises a charging/discharging controller, connected to the compensation unit, the phase comparator, and the low pass filter, for determining and generating the control signal according to the comparison result of the phase comparator and the output of the compensation unit.

3. The phase-locked loop as claimed in claim 2, wherein the charging/discharging controller comprises:
    a first switch, connected to a first voltage by a first terminal of the first switch, for determining a connection state of the first switch according to the comparison result of the phase comparator;
    a charging current source, connected to a second terminal of the first switch by a first terminal of the charging current source, for determining a value of the current of the charging current source according to the output of the compensation unit, wherein a signal of a second terminal of the charging current source serving as the control signal;
    a discharging current source, connected to the second terminal of the charging current source by a first terminal of the discharging current unit, for determining the current value of the discharging current source according to the output of the compensation unit; and
    a second switch, connected to a second terminal of the discharging current source by a first terminal of the second switch and connected to a second voltage by a second terminal of the second switch, for determining a connection state of the second switch according to the comparison result of the phase comparator.

4. The phase-locked loop as claimed in claim 3, wherein the first voltage is a supply voltage, and the second voltage is a ground voltage.

5. The phase-locked loop as claimed in claim 3, wherein the compensation unit comprises:
    a first current source, including a first terminal connected to the first voltage;
    a second current source, including a first terminal connected to a second terminal of the first current source and an output of the copy unit, and a second terminal connected to the second voltage;
    a third current source, connected to the second voltage by the second terminal of the third current source, for determining the current value of the third current source according the second current source; and
    a fourth current source, including a first terminal connected to the first voltage, and a second terminal connected to a first terminal of the third current source;
    wherein the charging current source is determined according to the fourth current source, and the discharging current source is determined according to the second current source.

6. The phase-locked loop as claimed in claim 5, wherein the compensation unit further comprises:
    a first converting circuit, connected between the first terminal of the second current source and the low pass filter, for converting the control signal filtered by the low pass filter into a feedback current and transmitting the feedback current to the first terminal of the second current source.

7. The phase-locked loop as claimed in claim 1, wherein the low pass filter comprises:
    a resistor, electrically connected between the charging/discharging unit and the controlled oscillator by a first terminal of the resistor;

a first capacitor, including a first terminal electrically connected to a second terminal of the resistor, and a second terminal of the first capacitor electrically connected to a third voltage; and a second capacitor, including a first terminal electrically connected to the first terminal of the resistor, and a second terminal electrically connected to the third voltage.

8. The phase-locked loop as claimed in claim 7, wherein the third voltage is the ground voltage.

9. The phase-locked loop as claimed in claim 1, wherein the controlled oscillator further comprises:

a second converting circuit, for converting the control signal filtered by the low pass filter into the control current; and a current-controlled oscillation circuit, connected to the second converting circuit, for determining the frequency of the output signal according to the control current;

wherein the copy unit is electrically connected to the second converting circuit for determining the first compensation value according to the control current.

10. The phase-locked loop as claimed in claim 9, wherein the second converting circuit comprises:

a fifth current source, connected to a fourth voltage by a first terminal of the fifth current source, and connected the current-controlled oscillation circuit by a second terminal of the fifth current source, for outputting the control current, wherein the current of the fifth current source is determined according to the control signal.

11. The phase-locked loop as claimed in claim 10, wherein the fourth voltage is the supply voltage.

12. The phase-locked loop as claimed in claim 9, wherein the current-controlled oscillation circuit comprises:

a NOT gate series, including an input terminal connected to an output terminal of the NOT gate series and providing the output signal from the output terminal of the NOT gate series, wherein the NOT gate series is formed by an odd number of NOT gates and an operating speed of the NOT gates is determined by the control current.

13. The phase-locked loop as claimed in claim 9, wherein the copy unit comprises:

a plurality of candidate current sources, coupled to the second converting circuit, wherein each of the candidate current sources determines the current value thereof respectively according to the control current to generate the candidate currents; and a multiplexer, electrically connected to the candidate current sources, wherein the multiplexer selects one of the candidate currents generated by the candidate current sources as the first compensation value according to a second control signal.

14. The phase-locked loop as claimed in claim 9, wherein the copy unit comprises:

a plurality of candidate current sources, coupled to the second converting circuit, wherein each of the candidate current sources determines the current value thereof according to the control current to generate the candidate currents; and a plurality of candidate switches, electrically connected to the plurality of candidate current sources respectively, wherein each of the candidate switches determines the connection state thereof according to a second control signal;

wherein the copy unit determines to select at least one of the candidate currents according to the connection state of the candidate switches, and the sum of the selected candidate currents serves as the first compensation value.

* * * * *